United States Patent [19]

Schweitzer, Jr.

[11] 4,034,360

[45] July 5, 1977

[54] SYSTEM FOR DISABLING THE RESET CIRCUIT OF FAULT INDICATING MEANS

[76] Inventor: Edmund O. Schweitzer, Jr., 1002 Dundee Road, Northbrook, Ill. 60062

[22] Filed: Aug. 6, 1976

[21] Appl. No.: 712,281

[52] U.S. Cl. .............................. 340/253 A; 324/133
[51] Int. Cl.² .......................................... G08B 21/00
[58] Field of Search ............... 340/253 A; 324/133

[56] References Cited

UNITED STATES PATENTS

| | | | |
|---|---|---|---|
| 3,816,816 | 6/1974 | Schweitzer | 340/253 A |
| 3,866,197 | 2/1975 | Schweitzer | 340/253 A |
| 3,906,477 | 9/1975 | Schweitzer | 340/253 A |

*Primary Examiner*—Thomas B. Habecker
*Attorney, Agent, or Firm*—Lockwood, Dewey, Zickert & Alex

[57] ABSTRACT

The reset circuit of a fault indicator is disabled to prevent automatic restoration of the movable target from fault indicating position where it can be observed and manually rest. A manually operable switch is connected across the reset ciruit and its contacts are closed by permanent magnet means or by manually operable switch means.

8 Claims, 7 Drawing Figures

SYSTEM FOR DISABLING THE RESET CIRCUIT OF FAULT INDICATING MEANS

This invention relates, generally, to automatically resettable alternating current fault indicators and it has particular relation to disabling means therefor. It constitutes an improvement over the fault indicating systems disclosed in my U.S. Pat. Nos. 3,816,816, issued June 11, 1974 and 3,906,477, issued Sept. 16, 1975.

On the occurrence of a fault on an alternating current distribution system an automatically reclosable circuit breaker may be opened and reclosed in an attempt to maintain service continuity. The fault may be of a transient nature, such as a tree branch engaging a conductor or conductors swinging into contact, which disappears and permits the circuit breaker to remain reclosed. An automatically resettable fault indicator on such a system does not continue to display the occurrence of the fault and the indication is lost thus reducing the possibility of locating the fault and taking steps to prevent its reoccurrence.

Among the objects of this invention are: To provide for disabling the reset circuit of an automatically resettable fault indicator in order to maintain the fault indication after the circuit has been restored to normal operating conditions; to arrange for manually operable switch means to short circuit a part of the reset circuit; to employ a reed switch having contacts of magnetic material for this purpose and to close them by shifting the position of a permanent magnet relative to the contacts; to use a circular magnet for this purpose located outside the fault indicator, magnetized along a diameter, and manually pivotable about its center; to use a bar permanent magnet pivoted at one end for this purpose; and to use an over-center toggle switch for this purpose.

In the drawings:

FIG. 1 shows diagrammatically the circuits disclosed in my U.S. Pat. No. 3,906,477 modified in accordance with the present invention;

Figure 1:
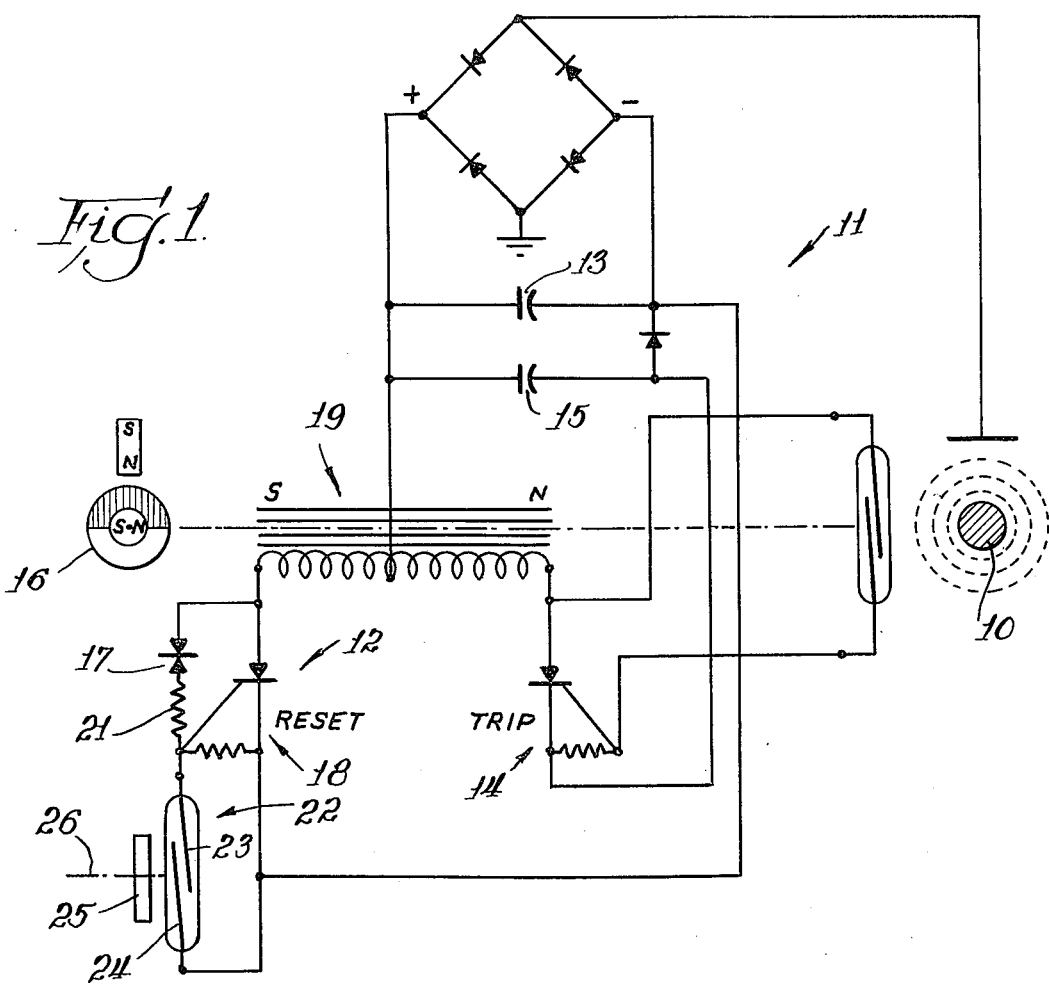
Figure 6:
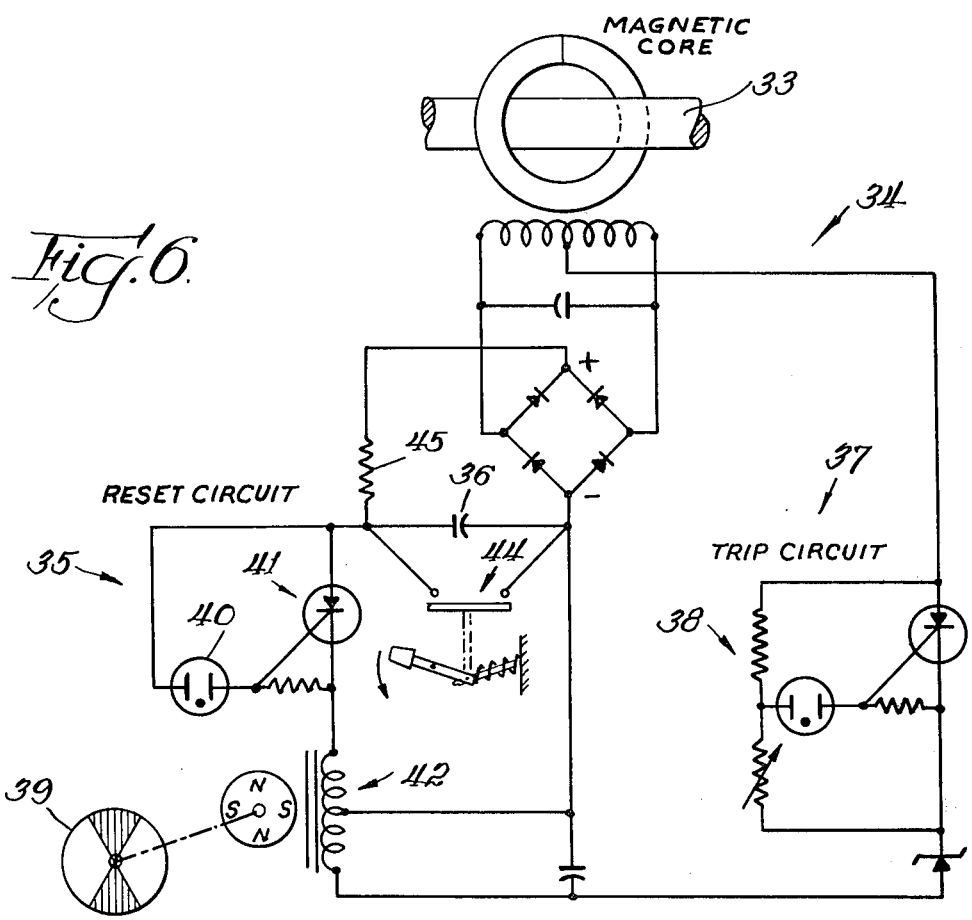
Figure 7:
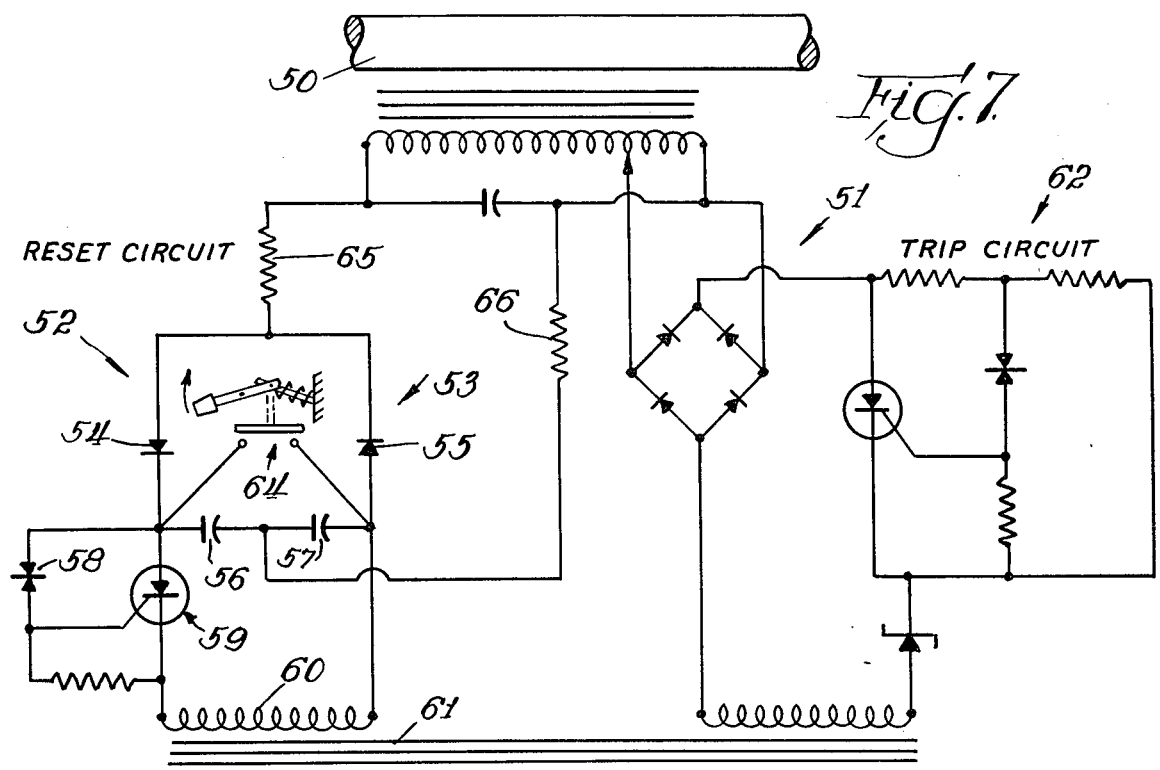

FIG. 6 shows one of the circuits from my U.S. Pat. No. 3,816,816 modified in accordance with this invention;

FIG. 7 shows another of the circuits in my U.S. Pat. No. 3,816,816 modified in accordance with this invention;

Referring now to FIG. 1 it will be observed that reference character 10 designates a conductor of a high voltage distribution circuit as disclosed in my U.S. Pat. No. 3,906,477. Associated with the conductor 10 are automatically resettable fault indicator circuits 11 which include a reset circuit 12 that is energized from a capacitor 13. Also provided is a trip circuit as indicated at 14 which is energized on discharge of capacitor 13 and also capacitor 15. A target disc 16 is arranged to be shifted from one position to another in order to indicate that either a fault has occurred on the conductor 10 or that no fault has occurred.

The reset circuit 12 includes a trigger diode 17 that controls the operation of an SCR 18. When it is rendered conducting, a magnetic field structure, indicated generally at 19, is energized to shift the target disc 16 to the reset position.

In accordance with this invention provision is made for preventing the energization of the magnetic field structure 19 to return the target disc 16 to the reset position. The reason for this is to permit the lineman to detect by observation of the position of the target disc 16 that a fault has occurred on the conductor 10. Otherwise, the targes disc 16 would be automatically reset. For this purpose a current limiting resistor 21 is provided in series with the trigger diode 17 and a reed switch 22 is connected across the SCR. The reed switch 22 includes contact members 23 and 24 of magnetic material that are normally biased to the open position. They are arranged to be closed by a circular permanent magnet 25 that is pivoted about an axis 26.

Figure 2:
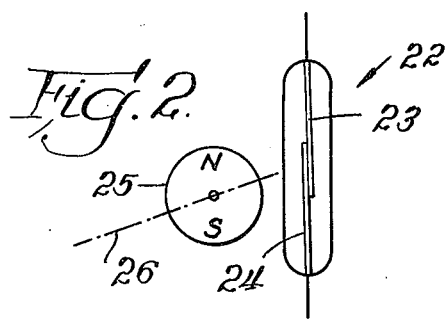
FIG. 2 shows the reed switch in the closed position with the control permanent magnet positioned to hold the contacts closed.
Figure 3:
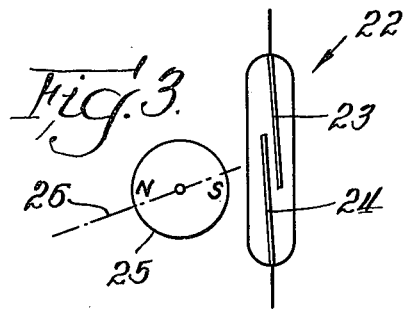
FIG. 3 is a view, similar to FIG. 2, showing the permanent magnet rotated through 90° and the contacts of the reed switch in the open position.

As shown in FIGS. 2 and 3, the permanent magnet 25 is provided with opposite poles along a diameter. When these poles are parallel to the contact member 23 and 24, as shown in FIG. 2, they are held closed against the inherent biasing action thereof tending to open them. In this manner the reset circuit 12 is not energized and current through it is limited by the current limiting resistor 21.

After the position of the target disc 16 has been noted, indicating that fault current has flowed through the conductor 10, the permanent magnet 25 is pivoted about the axis 26 to the position shown in FIG. 3 where the poles are located along a line that is at right angles to the contact members 23 and 24. They are then biased to the open position.

It will be understood that the reset circuit 12 does not function when the permanent magnet 25 occupies the position shown in FIG. 2. When the permanent magnet 25 is pivoted to the position shown in FIG. 3, contact members 23 and 24 are separated and the target disc 16 then is returned to the reset position.

Figure 4:
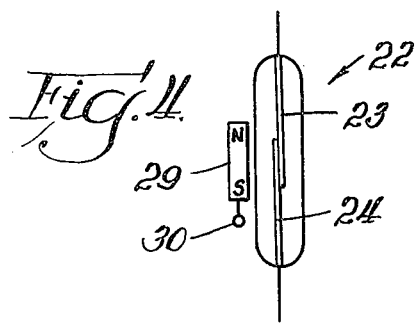
FIG. 4 is a view, similar to FIG. 2, but employing a bar magnet that is pivoted at one end, the contacts being shown closed.
Figure 5:
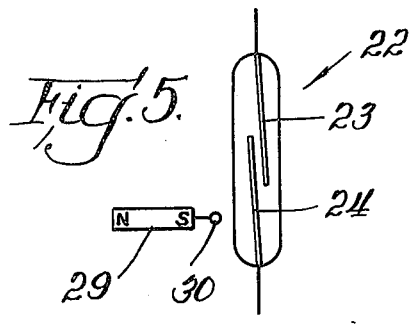
FIG. 5 is a view, similar to FIG. 4, showing the bar magnet pivoted through 90° and the contacts of the reed switch in the open position.

FIGS. 4 and 5 show another embodiment of this invention. Here a bar magnet 29 polarized as indicated is pivoted at 30. In FIG. 4 the bar magnet 29 is shown parallel to the contact members 23 and 24 and holds them in contact engagement thereby preventing operation of the reset circuit 12. When the bar magnet 29 is pivoted to the position shown in FIG. 5, the contact members 23 and 24 are separated. The target disc 16 then is returned to the reset position.

FIG. 6 shows one of the circuits illustrated in my U.S. Pat. No. 3,816,816 that is arranged to be reset automatically on restoration of current flow in a conductor 33. Here reference character 34 designates, generally, an automatically resettable fault indicating circuit which includes a reset circuit 35 that is energized when a capacitor 36 is charged. There is provided also a trip circuit that is indicated, generally, at 37 which is arranged to be energized when the current flow in the conductor 33 exceeds a predetermined value. The trip circuit 37 includes a voltage divider circuit that is indicated, generally, at 38.

The occurrence of flow of fault current in the conductor is indicated by a target disc 39.

The reset circuit 35 includes a glow discharge device 40 that is arranged to render conducting an SCR for energizing a magnetic field structure that is indicated, generally, at 42. Energy for energizing the magnetic field structure 42 is obtained from a capacitor 36 which is charged on return of current flow in the conductor 33.

In accordance with this invention the reset circuit 35 is disabled by short circuiting the capacitor 36. For this purpose there is provided normaly open manually operable contact means, indicated generally at 44. The contact means 44 are in the form of a over-center toggle switch. When it is desired to prevent automatic resetting of the target disc 39, the toggle switch 44 is operated to the closed position. Current flow is limited by resistor 45. As long as the contacts of the contact means 44 remain closed and the capacitor 36 short circuited, a charge cannot be built up on the capacitor 36 sufficient to effect energization of the reset circuit 35. Accordingly, the target disc 39 remains in the tripped position for subsequent observation. Then a lineman can operate the contact means 44 to shift its contacts to the open position in order to allow the target disc 39 to be reset by subsequent charging of the capacitor 36 on continued flow of current in the conductor 33.

In FIG. 7 there is disclosed a conductor 50 arranged to be energized at a relatively high voltage and through which 60 Hz current flows. This is another circuit in my U.S. Pat. No. 3,816,816. Associated with the conductor 50 are automatically resettable fault indicating circuits, indicated genrally at 51, and described in detail in my U.S. Pat. No. 3,816,816. These circuits include a reset circuit, indicated generally at 52, which employs a voltage doubler circuit 53 that includes rectifiers 54 and 55 and capacitors 56 and 57. A trigger diode 58 is arranged to control the operation of an SCR 59 for effecting the energization of a winding 60 of a magnetic field structure 61 which is arranged to control the position of a target disc such as the target disc 16 or 39 above referred to. A trip circuit, shown generally at 62, is also arranged to control the energization of the magnetic field structure 61 for the purpose of shifting the target disc to the tripped or fault indicating position.

With a view to preventing the operation of the target disc or energization of the magnetic field structure 61 when current flow is resumed in the conductor 50, normally open manually operable contact means, indicated generally at 64, is employed and is connected, when closed to short circuit the capacitors 56 and 57 in the voltage doubler circuit 53. Resistors 65 and 66 limit the flow of current when the contacts of the contact means 64 are closed. As long as they remain closed, the fault indication provided by the target disc remains undisturbed even though flow of current is resumed in the conductor 50. On opening of contact means 64 manually after observation of the associated target disc, it is automatically reset to the non-indicating position.

I claim:

1. Fault indicating means responsive to flow of fault current in an electrical distribution system comprising: indicator means movable from one position to another position on flow of fault current in said system, a trip circuit responsive to flow of fault current in said system to shift said indicator means from said one position to said other position, a reset circuit to shift said indicator means automatically back to said one position on restoration of said system to normal operating condition; and manually operable means for disabling said reset circuit to maintain said indicator means in said one position.

2. Fault indicating means according to claim 1 wherein said disabling means includes switch means connected across a portion of said reset circuit.

3. Fault indicating means according to claim 2 wherein said switch means includes magnetically operable contacts, and means generating a magnetic field is juxtaposed to said switch means to close said contacts.

4. Fault indicating means according to claim 2 wherein a permanent magnet is movably adjacent said switch means and is arranged in one position to close said contacts and in another position to open said contacts.

5. Fault indicating means according to claim 4 wherein said permanent magnet is pivoted intermediate its ends.

6. Fault indicating means according to claim 4 wherein said permanent magnet is pivoted at one end.

7. Fault indicating means according to claim 2 wherein said switch means includes: normally open contact means, and manually operable means for closing said contact means.

8. Fault indicating means according to claim 7 wherein over-center toggle means cooperates with said manually operable means for closing said contact means.

* * * * *

UNITED STATES PATENT AND TRADEMARK OFFICE
CERTIFICATE OF CORRECTION

PATENT NO. : 4,034,360
DATED : July 5, 1977
INVENTOR(S) : Edmund O. Schweitzer, Jr.

It is certified that error appears in the above-identified patent and that said Letters Patent are hereby corrected as shown below:

Column 3, line 10, "a" should be -- an --.

In the Claims:

Claim 4, line 2, after "movably" insert -- mounted --.

Signed and Sealed this

Eleventh Day of October 1977

[SEAL]

Attest:

RUTH C. MASON
Attesting Officer

LUTRELLE F. PARKER
Acting Commissioner of Patents and Trademarks